(12) United States Patent
Guo et al.

(10) Patent No.: US 11,467,487 B2
(45) Date of Patent: Oct. 11, 2022

(54) METHOD FOR MANUFACTURING TEMPLATE

(71) Applicant: BOE TECHNOLOGY GROUP CO., LTD., Beijing (CN)

(72) Inventors: Kang Guo, Beijing (CN); Lu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/632,041

(22) PCT Filed: Jan. 3, 2019

(86) PCT No.: PCT/CN2019/070246
§ 371 (c)(1),
(2) Date: Jan. 17, 2020

(87) PCT Pub. No.: WO2020/140234
PCT Pub. Date: Jul. 9, 2020

(65) Prior Publication Data
US 2021/0223685 A1    Jul. 22, 2021

(51) Int. Cl.
*G03F 1/68* (2012.01)
*H01L 21/033* (2006.01)
(Continued)

(52) U.S. Cl.
CPC ............. *G03F 1/68* (2013.01); *G02B 5/1809* (2013.01); *G02B 5/1857* (2013.01); *G03F 7/40* (2013.01);
(Continued)

(58) Field of Classification Search
CPC .... G03F 7/70383; G03F 7/70408; G03F 7/40; G02B 5/18; G02B 6/136; H01S 5/0203;
(Continued)

(56) References Cited

U.S. PATENT DOCUMENTS 4,696,697 A  *  9/1987  Kitano ................... C09G 1/02
                                                        106/3
5,021,649 A  *  6/1991  Nishimura ............ G01D 5/38
                                                        250/237 G
(Continued)

FOREIGN PATENT DOCUMENTS

JP        59-174804    * 10/1984
JP        60-191209    *  9/1985
(Continued)

OTHER PUBLICATIONS

Machine translation of JP 10-178238 ( 1998 ).*
(Continued)

*Primary Examiner* — Martin J Angebranndt
(74) *Attorney, Agent, or Firm* — Collard & Roe, P.C.

(57) ABSTRACT

A manufacturing method of a template includes: providing a base; forming a photoresist pattern on the base and patterning the base by using the photoresist pattern as a mask, and the forming the photoresist pattern includes: forming a plurality of first patterns spaced apart from each other on the base; forming a first material layer on the plurality of first patterns; patterning the at least one first pattern by using the first material layer as a mask so that the first pattern is formed into at least one first sub-pattern; and removing the first material layer; and the first material layer at least cover one side of at least one of the plurality of first patterns in a direction perpendicular to a surface on which the base is located.

17 Claims, 8 Drawing Sheets

(51) Int. Cl.
| | |
|---|---|
| *H01L 21/302* | (2006.01) |
| *G03F 7/40* | (2006.01) |
| *H01S 5/02* | (2006.01) |
| *G02B 5/18* | (2006.01) |
| *G03F 7/20* | (2006.01) |
| *B24B 19/02* | (2006.01) |

(52) U.S. Cl.
CPC ...... *G03F 7/70383* (2013.01); *G03F 7/70408* (2013.01); *H01L 21/0337* (2013.01); *H01L 21/302* (2013.01); *H01S 5/0203* (2013.01); *B24B 19/02* (2013.01)

(58) Field of Classification Search
CPC . H01S 5/026; H01S 5/12; B24B 19/02; H01L 21/0337; H01L 21/302; H01L 21/0203
See application file for complete search history.

(56) References Cited

U.S. PATENT DOCUMENTS

| | | | | | |
|---|---|---|---|---|---|
| 5,142,385 | A | * | 8/1992 | Anderson | G03F 7/001 250/201.9 |
| 5,744,219 | A | * | 4/1998 | Tahara | G03H 1/0252 428/32.64 |
| 8,426,121 | B2 | * | 4/2013 | Brueck | H01L 21/0337 430/323 |
| 2002/0023389 | A1 | * | 2/2002 | Minamihaba | C09K 3/1463 106/3 |
| 2003/0086030 | A1 | * | 5/2003 | Taniguchi | G02F 1/133615 349/61 |
| 2004/0253822 | A1 | * | 12/2004 | Matsui | H01L 21/76808 438/690 |
| 2005/0074976 | A1 | * | 4/2005 | Kim | H01L 21/3212 438/692 |
| 2005/0236585 | A1 | * | 10/2005 | Miyake | G03F 7/70033 250/492.2 |
| 2006/0154573 | A1 | * | 7/2006 | Feng | B24B 49/16 451/41 |
| 2007/0285782 | A1 | * | 12/2007 | Stuck | C09C 1/0015 359/569 |
| 2011/0073775 | A1 | * | 3/2011 | Setija | G03F 7/70633 250/492.1 |
| 2012/0028195 | A1 | | 2/2012 | Wu et al. | |
| 2012/0164846 | A1 | | 6/2012 | Ha et al. | |
| 2014/0073137 | A1 | * | 3/2014 | Cinnor | H01L 21/0337 438/703 |
| 2014/0234466 | A1 | | 8/2014 | Gao et al. | |
| 2015/0024597 | A1 | | 1/2015 | Gao et al. | |
| 2015/0241613 | A1 | * | 8/2015 | Chan | G02B 30/30 359/485.05 |
| 2016/0025897 | A1 | * | 1/2016 | Twitchen | G02B 5/1876 359/356 |
| 2019/0062597 | A1 | * | 2/2019 | Shi | H01L 21/3212 |
| 2020/0158943 | A1 | * | 5/2020 | Calafiore | G02B 5/1814 |

FOREIGN PATENT DOCUMENTS

| | | | |
|---|---|---|---|
| JP | 62-166520 | * | 7/1987 |
| JP | 02-219001 | * | 8/1990 |
| JP | 03-270227 | * | 12/1991 |
| JP | 06-043312 | * | 2/1994 |
| JP | 10-178238 | * | 6/1998 |
| JP | 2002-170289 | * | 6/2002 |
| JP | 2006-147701 | * | 6/2006 |
| JP | 2006-318969 | * | 11/2006 |
| JP | 2011192906 A | * | 9/2011 |
| KR | 20090069770 | * | 7/2009 |

OTHER PUBLICATIONS

Machine translation of JP 60-191209 ( 1985 ).*
Machine translation of JP 02-219001 (1990).*
Machine translation of KR 2009-0069770 (2009).*
Machine translation of JP 03-270227 (1991 ).*
Machine translation of JP 59-174804 (Oct. 1984 ).*
Machine translation of JP 2006-318969 (Nov. 2006).*
Carpio et al. "Initial study of copper CPM slurry chemistries" Thin Sol. Films, vol. 266 pp. 238-244 (1995).*
Machine translation of JP 2006-147701 (Jun. 2006).*
Extended European Search Report in European Application No. 19907921.1 dated Jul. 19, 2022.

* cited by examiner (a)

(b)

(a)

(b)

(a)

(b)

METHOD FOR MANUFACTURING TEMPLATE

CROSS REFERENCE TO RELATED APPLICATION

This application is the National Stage of PCT/CN2019/070246 filed on Jan. 3, 2019, the disclosure of which is incorporated by reference.

TECHNICAL FIELD

At least one embodiment of the present disclosure relates to a method for manufacturing a template.

BACKGROUND

Products produced by using templates, such as imprint templates, have advantages of high resolution, low cost, and high productivity, and therefore, imprint templates are widely used in semiconductor manufacturing, micro-electromechanical systems, bio-chips, biomedicine, and other fields. Imprinting technology in general refers to transfer a pattern to a corresponding product by means of the template, and realize transferring of the pattern by way of imprinting. Therefore, a size of the pattern imprinted on the product is affected by the fineness of the imprint template.

However, according to a manufacturing process of the current template, it is difficult to further reduce a line width of the template pattern while the manufacturing efficiency is required to be ensured.

SUMMARY

At least one embodiment of the present disclosure provides a manufacturing method of a template, the method includes: providing a base; forming a photoresist pattern on the base, comprising: forming a plurality of first patterns spaced apart from each other by using a photoresist on the base; forming a first material layer on the plurality of first patterns, the first material layer at least covering one side of at least one of the plurality of first patterns in a direction perpendicular to a surface on which the base is located; patterning the at least one first pattern by using the first material layer as a mask so that the first pattern is formed into at least one first sub-pattern; and removing the first material layer; and patterning the base by using the photoresist pattern as a mask.

For example, in the manufacturing method provided by at least one embodiment of the present disclosure, the at least one first pattern is patterned by using the first material layer as a mask, so that one of the first patterns is formed into two of the first sub-patterns.

For example, in the manufacturing method provided by at least one embodiment of the present disclosure, in the direction perpendicular to the surface on which the base is located, the first material layer covers both sides of the at least one first pattern and exposes a middle portion of the at least one first pattern.

For example, in the manufacturing method provided by at least one embodiment of the present disclosure, the forming a plurality of first patterns spaced apart from each other on the base comprises: forming a photoresist layer on the base; patterning the photoresist layer; and post-baking and processing the photoresist layer to form the plurality of first patterns.

For example, in the manufacturing method provided by at least one embodiment of the present disclosure, a vertical cross-section shape of the first pattern comprises a semi-circle-like shape.

For example, in the manufacturing method provided by at least one embodiment of the present disclosure, the photoresist layer comprises a plurality of photoresist strips having a vertical cross-section with a rectangle-like shape, and the post-baking the photoresist layer comprises: heating the photoresist strip, so that the photoresist strip is melted; and cooling and curing the photoresist strip, to form the plurality of first patterns; and after the photoresist strip is melted, the vertical cross-section shape of the photoresist strip changes from a rectangle-like shape to a semicircle-like shape.

For example, in the manufacturing method provided by at least one embodiment of the present disclosure, the photoresist layer is patterned by using a laser beam.

For example, in the manufacturing method provided by at least one embodiment of the present disclosure, the photoresist pattern has a line width less than or equal to 100 nm.

For example, in the manufacturing method provided by at least one embodiment of the present disclosure, the forming the first material layer on the plurality of first patterns comprises: depositing a first material film layer on the plurality of first patterns, to cover the plurality of first patterns; and thinning the first material film layer, to expose a portion of at least one of the plurality of first patterns, a remaining portion of the first material film layer is the first material layer.

For example, in the manufacturing method provided by at least one embodiment of the present disclosure, the forming the photoresist pattern on the base further comprises: after removing the first material layer, depositing a second material film layer on the first sub-pattern, to cover the first sub-pattern; thinning the second material film layer, to expose a portion of at least one of the first sub-pattern, and a remaining portion of the second material film layer is a second material layer; patterning the at least one first sub-pattern by using the second material layer as a mask, so that the first sub-pattern is formed into at least one second sub-pattern; and removing the second material layer.

For example, in the manufacturing method provided by at least one embodiment of the present disclosure, the forming the photoresist pattern on the base further comprises: after removing the remaining portion of the first material film layer, depositing a second material film layer on a remaining portion of the photoresist on the base, to cover the remaining portion of the photoresist; thinning the second material film layer, to expose a portion of the remaining portion of the photoresist; patterning the remaining portion of the photoresist by using a remaining portion of the second material film layer as a mask; and removing the remaining portion of the second material film layer; and the above steps are repeatedly performed at least once, so that the first sub-pattern is formed into at least one third sub-pattern.

For example, in the manufacturing method provided by at least one embodiment of the present disclosure, the patterning the base by using the photoresist pattern as the mask comprises: patterning the base by using the photoresist pattern, to form a groove or an opening penetrating through the base in a region of the base not covered by the photoresist pattern.

For example, in the manufacturing method provided by at least one embodiment of the present disclosure, the base comprises a first base substrate and a first film layer covering the first base substrate, and the patterning the base by using the photoresist pattern as the mask comprises: patterning the first film layer by using the photoresist pattern, to form a first opening penetrating through the first film layer in a region of the first film layer not covered with the photoresist pattern, so as to form a first mask by using the first film layer; patterning the first base substrate by using the first mask, forming a groove or a second opening penetrating through the first base substrate in a region of the first base substrate not covered by the first mask; and removing the first mask.

For example, in the manufacturing method provided by at least one embodiment of the present disclosure, the first film layer comprises an inorganic film.

For example, in the manufacturing method provided by at least one embodiment of the present disclosure, the first material layer comprises a metal layer.

For example, in the manufacturing method provided by at least one embodiment of the present disclosure, in a direction parallel to the surface on which the base is located and perpendicular to an extending direction of the plurality of first patterns, a size of a portion of the first pattern which is exposed by the first material layer is 2% to 20% of a size of the first pattern.

For example, in the manufacturing method provided by at least one embodiment of the present disclosure, a method for thinning includes a chemical mechanical grinding.

At least one embodiment of the present disclosure provides a template, the template is obtained by the method of any one of the above embodiments.

For example, in the template provided by at least one embodiment of the present disclosure, the template at least includes a pattern that are formed by using the photoresist pattern, and the pattern has a line width less than or equal to 100 nm.

For example, in the template provided by at least one embodiment of the present disclosure, a region of the template that is formed by etching the photoresist pattern has a depth-to-width ratio of 1/10 to 1/100.

At least one embodiment of the present disclosure provides a device. The device has at least a portion of elements produced by using the template of any one of the above embodiments.

BRIEF DESCRIPTION OF THE DRAWINGS

In order to more clearly illustrate technical solutions of embodiments of the present disclosure, drawings of the embodiments will be briefly introduced below, and obviously drawings described below involve only some embodiments of the present disclosure, but are not to limit the present disclosure.

FIG. 4A and FIG. 4B, FIG. 6A and FIG. 6B are process diagrams of a method for manufacturing another template provided by some embodiments of the present disclosure.

DESCRIPTION OF THE EMBODIMENTS

Figure 1A:
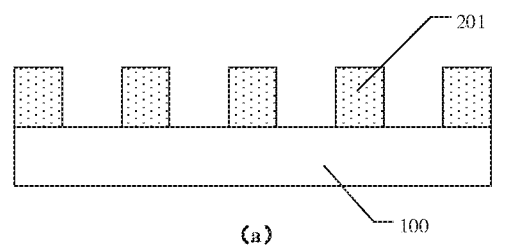
FIG. 1A to FIG. 1F are partial process diagrams of a method for manufacturing a template provided by some embodiments of the present disclosure.
Figure 1A:
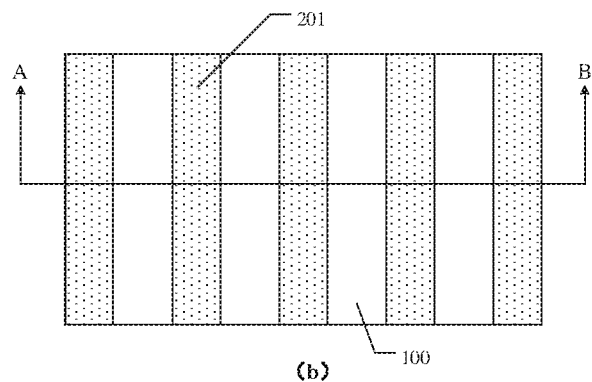

In order to make the object, technical solutions and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, the technical or scientific terms used herein shall have ordinary meaning understood by one of ordinary skill in the art to which the invention belongs. The terms "first", "second," and the like used in the present disclosure are not intended to indicate any order, amount, or importance, but distinguish different constituent parts. The terms "comprise," "comprising," "include," "including," etc., means that an element or object preceding the word encompasses element(s) or object(s) listed after this word and equivalents thereof, without excluding other elements or objects. The terms "connected" or "connecting" and the like are not limited to physical or mechanical connections, but may include electrical connections, whether direct or indirect. "On", "under", "left", "right" and the like are only used to indicate relative positional relationships, and when an absolute position of an object described is changed, its relative positional relationship may also be changed accordingly.

A method for manufacturing a current template, such as a template for nanoimprinting, mainly includes an electron beam direct writing, a laser direct writing, a laser interference, and the like. An imprint template with relatively high fineness (less than 100 nm) can be obtained by using the electron beam direct writing, however, it has a long process time and a low efficiency. For the laser direct writing, the laser interference and other methods, although the efficiency of production is significantly better than the electron beam direct writing, it is difficult to obtain a high fine imprint template, and a pattern of the obtained imprint template in general have a line width greater than 200 nm. However, for a process of manufacturing the current template, regardless of the electron beam direct writing, the laser direct writing, the laser interference, or other methods, it is difficult to further improve the fineness of the template while ensuring the production efficiency. The fineness of the template can indicate a size of the line width of and a density of the patterns, such as the imprint patterns, of the template. For example, for the imprint templates having the same area, if the imprint template has a large fineness, the imprint patterns of the imprint template have a small line width and/or a large number of the imprint patterns.

At least one embodiment of the present disclosure provides a method for manufacturing a template, the method includes: providing a base; forming a photoresist pattern on the base; and patterning the base by using the photoresist pattern as a mask. Forming the photoresist pattern includes: forming a plurality of first patterns spaced apart from each other by using a photoresist on the base; forming a first material layer on the plurality of first patterns; patterning at least one of the first patterns by using the first material layer as a mask, so that the first pattern is formed into at least one first sub-pattern; and removing the first material layer; patterning the base by using the photoresist pattern as a mask, wherein the first material layer at least covers one side of the at least one first pattern in a direction perpendicular to a surface on which the base is located.

For example, in the manufacturing method provided by at least one embodiment of the present disclosure, by using the first material layer formed on the first pattern as a mask, the first pattern is further patterned to obtain the first sub-pattern. As a result, no matter what a line width of the first pattern is, the first sub-pattern has a line width less than that of the first pattern, accordingly, the template produced by using the above photoresist pattern has a fineness greater than that of the template produced by the first pattern. Additionally, the aforementioned process for forming the first sub-pattern may be performed repeatedly, for example, the first sub-pattern is served as the first pattern for the next process, and thereby obtaining a second sub-pattern, a third sub-pattern and the like, which have a smaller line width than the first sub-pattern, i.e., obtaining a photoresist pattern with extremely small. For example, the first pattern may be obtained by using the current manufacturing method, which may be the electron beam direct writing, the laser direct writing, the laser interference and the like.

For example, in the manufacturing method provided by at least one embodiment of the present disclosure, the at least one first pattern is patterned by using the first material layer as a mask, so that the first pattern is formed into two of the first sub-patterns. For example, in the direction perpendicular to the surface on which the base is located, the first material layer covers both sides of the at least one first pattern and exposes a middle portion of the at least one first pattern. In this manner, after patterning the first pattern by using the first material layer, the first pattern may be formed two first sub-patterns spaced apart from each other, and thereby reducing the line width of the photoresist pattern and increasing the number of the line strips included in the photoresist pattern, so that the template formed by the photoresist pattern have an enhanced fineness. For example, the first material layer covers both sides of each of the first patterns and exposes the middle portion of each of the first patterns, so that after patterning the first pattern by using the first material layer, the number of the first sub-patterns on the base is twice as large as the number of the first patterns. For example, after the aforementioned process for forming the first sub-patterns is performed repeatedly, the number of patterns on the base may be four times, eight times or even more, as large as the number of the first patterns.

For example, in the manufacturing method provided by at least one embodiment of the present disclosure, the photoresist pattern has a line width less than or equal to 100 nm. Exemplarily, in the current process, due to limitation of the apparatus and the like, it is difficult for the pattern (equivalent to the first pattern of the embodiments of the present disclosure) obtained by laser patterning (the laser direct writing or the laser interference and the like) to has a line width less than 200 nm. By the aforementioned manufacturing method, the first pattern with a line width of 200 nm can be formed into the first sub-patterns with a line width less than 100 nm.

For example, in the manufacturing method provided by at least one embodiment of the present disclosure, the forming a plurality of first patterns spaced apart from each other includes: forming a photoresist layer on the base; patterning the photoresist layer; and post-baking and treating the photoresist layer to form the plurality of first patterns. The first pattern formed by post-baking has a vertical cross-section shape being as a semicircle-like shape, and the vertical cross-section shape is a narrow top and wide bottom shape. For example, one end of the first pattern away from the base has a cross-section width less than that of one end of the first pattern close to the base, which is benefit for the first material layer to cover both sides of the first pattern. It should be noted that in at least one embodiment of the present disclosure, a surface where the vertical cross-section is located is perpendicular to a surface where the base is located, and the semicircle-like shape may be a semicircular shape, or may be similar to a semicircular shape, such as a semi-ellipse-like shape, and the like.

For example, after the photoresist layer is patterned, a plurality of the photoresist strips spaced apart from each other are formed, and the photoresist strips are post-baked to form the first patterns. For example, the photoresist layer includes a plurality of photoresist strips having a vertical cross-section as a rectangle-like shape, and the post-baking the photoresist layer includes: heating the photoresist strips so that the photoresist strips are melted; and cooling and curing the photoresist strips to form the first patterns; in which after the photoresist strips are melted, the vertical cross-section shape of the photoresist strips changes from a rectangle-like shape to a semicircle-like shape. It should be noted that the rectangle-like shape may be a rectangular shape, or may also be similar to rectangular shape. For example, the photoresist strip obtained by a photolithography process has in theory a rectangular vertical cross-section, while in the actual photolithography process, due to the limitation of the precision of the apparatus, a side of the vertical cross-section of the photoresist strip in general has a certain inclination and radian, and a shape of the vertical cross-section has an approximately rectangular shape.

Figure 1B:
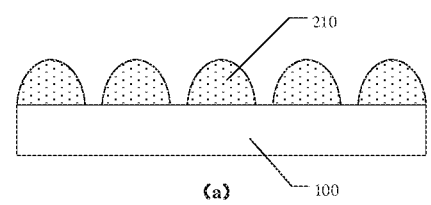
Figure 1B:
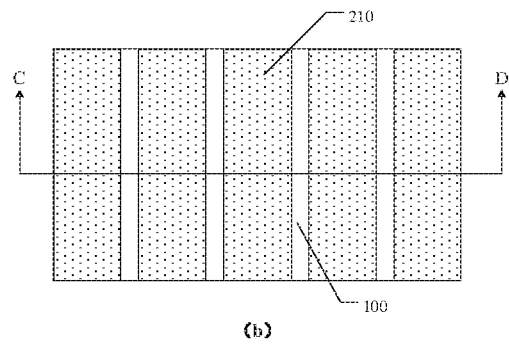
Figure 1C:
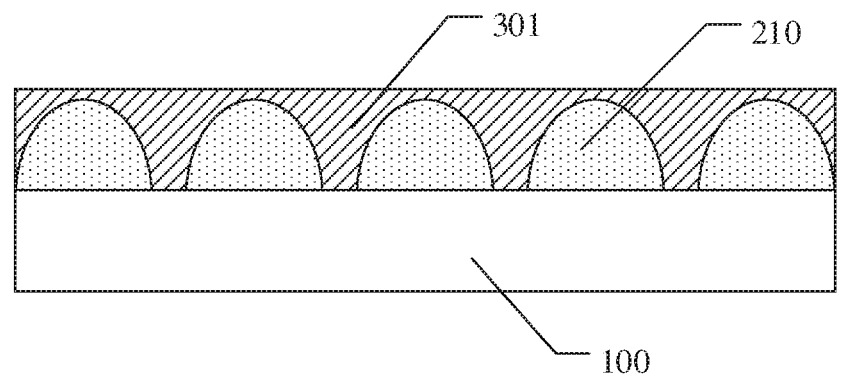
Figure 1D:
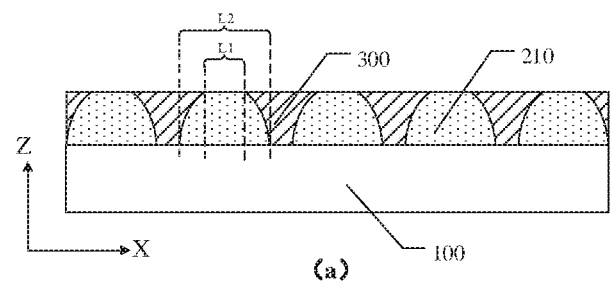
Figure 1D:
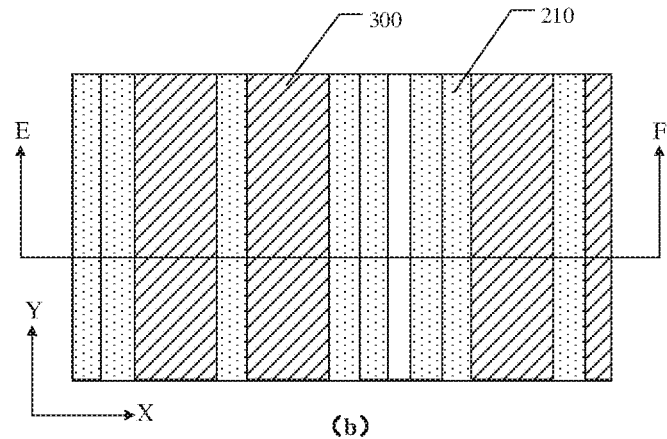

For example, in a manufacturing method provided by at least one embodiment of the present disclosure, forming the first material layer on the plurality of first patterns includes: depositing a first material film layer on the first patterns to cover the plurality of first patterns; and thinning the first material film layer, to expose a portion of at least one of the first patterns (e.g., an end of the first pattern facing away from the base, a region L1 of the first pattern 210 as shown in FIG. 1D); in which a remaining of the first material film layer is the first material layer. For example, an end of the first pattern away from the base has a size smaller than a size of an end of the first pattern close to the base. In this manner, during thinning the first material film layer, a middle portion of the first pattern is exposed firstly, both sides portion of the first pattern are still covered by the first material film layer, and with further thinning of the first material film, the middle portion of the first pattern has an increased exposed area.

For example, in the manufacturing method provided by at least one embodiment of the present disclosure, forming the photoresist pattern on the base further includes: after removing the first material layer, depositing a second material film layer on the first sub-pattern to cover the first sub-pattern; thinning the second material film layer to expose a portion of at least one of the first sub-patterns (e.g., an end of the first sub-pattern facing away from the base), and a remaining of the second material film layer is a second material layer; patterning at least one of the first sub-patterns by using the second material layer as a mask, so that the first sub-pattern is formed into at least one second sub-pattern; and removing the second material layer. In this manner, in a case of the first material layer covers both sides of the first pattern and exposes the middle portion of the first pattern, the number of the second sub-patterns is twice as large as the number of the first sub-patterns, and four times as large as the number of the first patterns.

For example, in the manufacturing method provided by at least one embodiment of the present disclosure, forming the photoresist pattern on the base further includes: after removing the remaining of the first material film layer, depositing a second material film layer on a remaining photoresist on the base to cover the remaining photoresist; thinning the second material film layer to expose a portion of the remaining photoresist (e.g., an end of the photoresist pattern facing away from the base); patterning the remaining photoresist by using a remaining of the second material film layer as a mask; and removing the remaining of the second material film layer; in which the above steps are repeatedly performed at least once, so that the first sub-pattern is formed into at least one third sub-pattern. In this manner, in a case that the first material layer covers both sides of the first pattern and exposes the middle portion of the first pattern, the number of the third sub-patterns is at least four times as large as the number of the first sub-patterns, and eight times as large as the number of the first patterns.

For example, in the manufacturing method provided by at least one embodiment of the present disclosure, patterning the base by using the photoresist pattern as the mask includes: patterning the base by using the photoresist pattern, to form a groove or an opening penetrating the base in a region of the base which is not covered by the photoresist pattern. For example, under a condition that the groove is formed on the base by using the photoresist pattern, the base may be formed into an imprint template; and under a condition that the opening is formed on the base by using the photoresist pattern, the base may be formed into a mask.

For example, in the manufacturing method provided by at least one embodiment of the present disclosure, the base includes a first base substrate and a first film layer for covering the first base substrate, and patterning the base by using the photoresist pattern as a mask includes: patterning the first film layer by using the photoresist pattern, to form a first opening penetrating the first film layer in a region of the first film layer that is not covered with the photoresist pattern, and a remaining portion of the first film layer is formed into a first mask. For example, the first mask may be served as a hard mask, by which the first base substrate is patterned, and may be formed into a shape with relatively large depth-to-width ratio. For example, the first film layer may be an inorganic material film layer.

For example, the manufacturing method provided by at least one embodiment of the present disclosure further includes: patterning the first base substrate by using the first mask, forming a groove or a second opening penetrating the first base substrate in a region of the first base substrate that is not covered by the first mask; and removing the first mask. For example, under a condition that the groove is formed on the first base substrate by using the first mask, the first base substrate may be formed into an imprint template; under a condition that the opening is formed on the first base substrate by using the first mask, the first base substrate may be formed into a mask.

For example, the manufacturing method provided by at least one embodiment of the present disclosure are explained in connection with the drawings.

FIG. 1A to FIG. 1F, FIG. 2A and FIG. 2B are process diagrams of a manufacturing method of a template provided by an embodiment of the present disclosure, in which the template obtained by using the manufacturing method is an imprint template (e.g., a nanoimprint template). The specific process for manufacturing the imprint template are as following.

As shown in the FIG. 1A, a base 100 is provided, a photoresist is deposited on the base 100 and performed with a patterning process to form a photoresist layer, and the photoresist layer includes a plurality of photoresist strips 201 spaced apart from each other. In FIG. 1A, figure. b is a plan view, and figure. a is a cross-sectional view of the figure. b taken along A-B. The photoresist strip 201 may have a shape of a straight-line segment type, as shown in FIG. 1A, or of a curved-line segment type (e.g., wavy), or other shapes.

For example, the patterning process may include: after coating the photoresist layer, exposing the photoresist layer with a mask, and developing the exposed photoresist layer to obtain a corresponding pattern, and the corresponding pattern is the first pattern in the embodiment of the present disclosure.

As shown in FIG. 1A and FIG. 1B, the photoresist layer is post-baked, the photoresist strip 201 is deformed and has a semicircle-like cross-section shape, and the photoresist strip 201 forms a first pattern 210. In FIG. 1B, figure. b is a plan view, and figure. a is a cross-sectional view of figure. b taken along C-D.

Under the high temperature, the photoresist may be melted, the post-baking process is required to heat the photoresist layer so that the photoresist strip is melted and deformed, and the vertical cross-section shape will change from other shapes (e.g., the rectangle in FIG. 1A) into a semicircle-like shape shown in FIG. 1B, and then, the photoresist is cooled and cured to obtain the first pattern 210. For example, after the photoresist strip has a semicircle-like cross-section shape, a cooling device may be used to reduce the temperature of the photoresist, or the photoresist may be naturally cooled. The post-baking process condition may be set according to a specific material of the photoresist, for example, the material of the photoresist includes polymethyl methacrylate (PMMA), and a temperature of the post-baking may be in a range of 170° C.-250° C. and a duration time may be in a range of 0.5 h-2 h.

For example, the photoresist layer may be patterned by using a laser beam and an electron beam.

As shown in FIG. 1B and FIG. 1C, a first material is deposited on the first pattern 210 to form a first material film layer 301.

As shown in FIG. 1C and FIG. 1D, a first material film layer 301 is thinned to expose a middle portion of the first pattern, a remaining portion of the first material film layer 301 is formed into a first material layer 300 after thinning, and both sides of the first pattern are covered by the first material layer 300. In FIG. 1D, figure. b is a plan view, and figure. a is a cross-sectional view of the figure. b taken along E-F.

For example, the thinning method may include a physical method, a chemical method or a combination thereof. The chemical thinning method may include liquid immersion, and the liquid may include but is not limited to one or more of sulfuric acid, nitric acid, hydrochloric acid, or hydrofluoric acid; the physical thinning method may include grinding, polishing and the like. For example, the thinning method may include a chemical mechanical grinding.

For example, in the chemical mechanical grinding, a grinding solution is acidic (e.g., contains HCl, etc.) and contains nano-grinded particles, e.g., silicon oxide (silicon dioxide), aluminum oxide and the like. For example, in the chemical mechanical grinding process, a surface polishing may be performed firstly by using the grinding solution, thereby thinning the first material film layer 301 and making a surface of the first material film layer 301 to change into a plane, and subsequently a cleaning solution is used for cleaning, in order to remove the grinding solution, residue produced by grinding of the first material film layer 301, and the like. The cleaning solution includes de-ionized water, the cleaning method may include spraying, immersion, ultrasound and the like.

For example, as shown in figure. a in FIG. 1D, in a direction (e.g., a X direction in FIG. 1D) parallel to a plane where the base 100 is located and perpendicular to an extending direction of the first patterns 210 (e.g., a Y direction in FIG. 1D), a size (width) L1 of a portion of the first pattern 210 exposed by the first material layer 300 is 2-20%, for example further 5%, 10%, 15%, of a size (width) L2 of the first pattern 210. A ratio (or an area ratio) of the size of the portion of the first pattern 210 exposed by the first material layer 300 to the size of the first pattern 210 may be designed depending on a size of the formed first sub-pattern, and is not limited to the aforementioned numerical range.

Figure 1E:
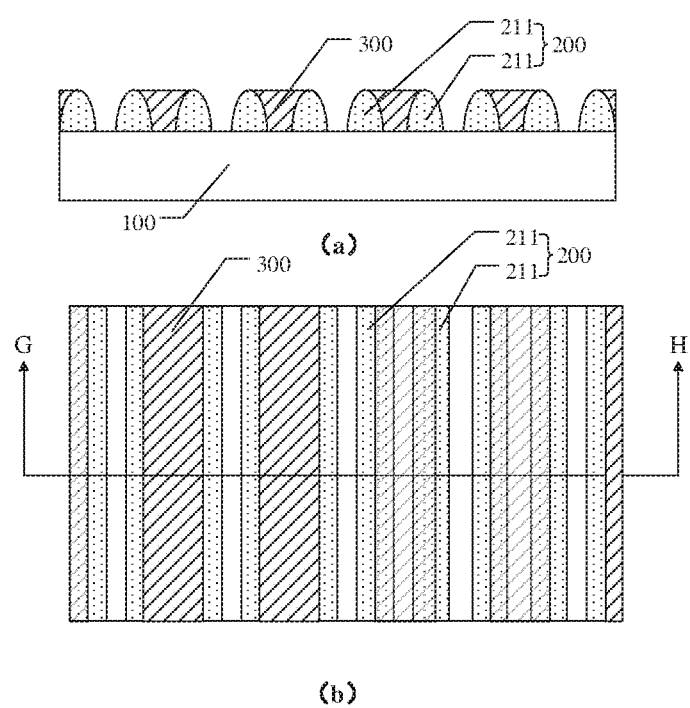

As shown in FIG. 1D and FIG. 1E, the first pattern 210 is etched by using the first material layer 300 as a mask, each of the first patterns 210 is formed into two first sub-patterns 211. The plurality of first sub-patterns 211 constitute the photoresist patterns 200. A process of etching the first patterns 210 may include a dry etching, and a gas of the dry etching has a small etching rate to the first material layer 300 and a large etching rate to the photoresist. In FIG. 1E, figure. b is a plan view, and figure. a is a cross-sectional view of the figure. b taken along G-H.

For example, the dry etching power is 200 w-1200 w, a duration time of the dry etching is 10 s-60 s, an atmosphere of the dry etching contains oxygen and nitrogen, and a composition ratio of oxygen and nitrogen is in a range of 0.3-0.7. In this manner, on the basis that the vertical cross-section shape of the first pattern 210 is a semicircle-like shape, a vertical cross-section shape of the first sub-pattern 211 obtained by dry-etching the first pattern 210 is also approximately a semicircle-like shape. The process condition for dry etching the first patterns 210 is not limited to the above scope, and may be adjusted depending on the actual process requirement.

For example, a material of the first material layer 300 may be an inorganic material. For example, the first material layer 300 may be a metal layer, a material of the first material layer may include aluminum, chromium, molybdenum, nickel, or the like; or, the material of the first material layer 300 may include silicon nitride, silicon oxide, silicon oxynitride, or the like. For example, in a case that the first material layer 300 is a metal layer, the etch selectivity ratio of the first material layer 300 and the first pattern 210 (the photoresist) is relatively large, which is advantageous for etching the first pattern 210. For example, the photoresist material may include polymethyl methacrylate (PMMA), epoxy resin, and the like.

For example, a gas for dry etching the first pattern 210 may have better anisotropy, for example, the gas may include nitrogen, oxygen, and the like. By using the anisotropic gas etching, during the etching, an undercut phenomenon as a result of an isotropic etching can be avoided, a distortion of the line width of the pattern can be avoided, which is beneficial to obtain a first sub-pattern having a semicircle-like cross-section shape.

Figure 1F:
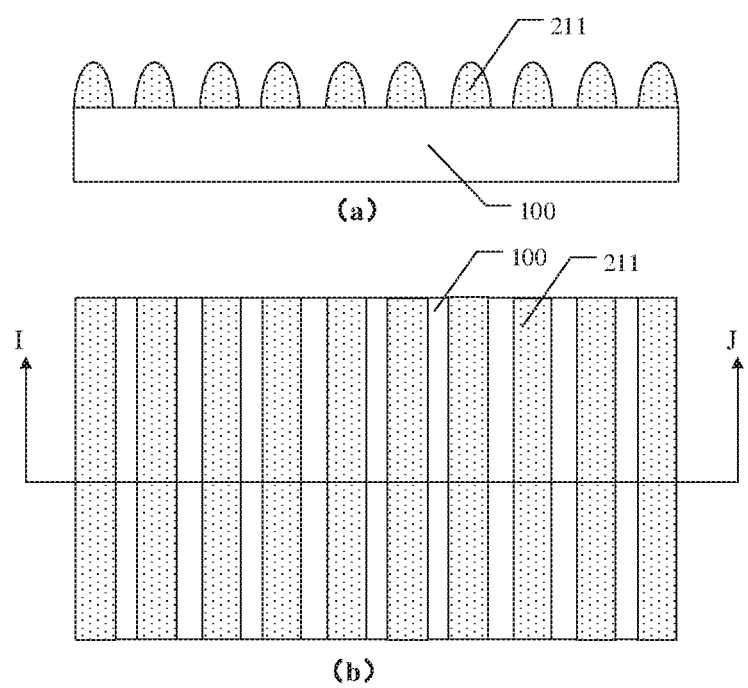

As shown in FIG. 1E and FIG. 1F, the first material layer 300 on the base 100 is removed. For example, a method for removing the first material layer 300 may include a dry etching and a wet etching. In FIG. 1F, figure. b is a plan view, and figure. a is a cross-sectional view of the figure. b taken along I-J.

Figure 2A:
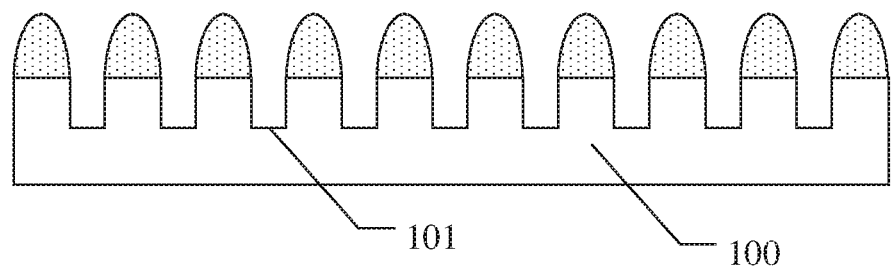
FIG. 2A and FIG. 2B are process diagrams of a method for manufacturing a template provided by some embodiments of the present disclosure.

As shown in FIG. 1F and FIG. 2A, the base 100 is patterned by using the first sub-pattern 211 as a mask, a region of the base 100 not covered by the first sub-pattern 211 forms a plurality of grooves 101. A process for patterning the base 100 may be a dry etching. A material used by the dry etching may be selected depending on the base material.

For example, an atmosphere of the dry etching may include $CHF_3$, $H_2$, Ar, a power may be 100 w-1000 w, and a duration time may be 10 s-90 s. The process condition for dry etching is not limited to the above scope, and may be adjusted depending on the actual process requirement.

Figure 2B:
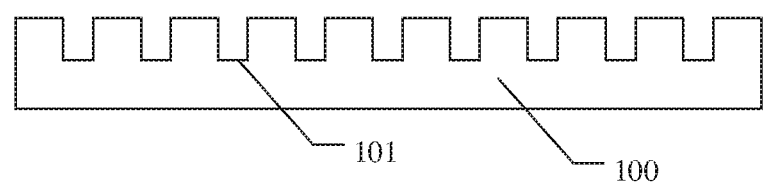
Figure 2B:
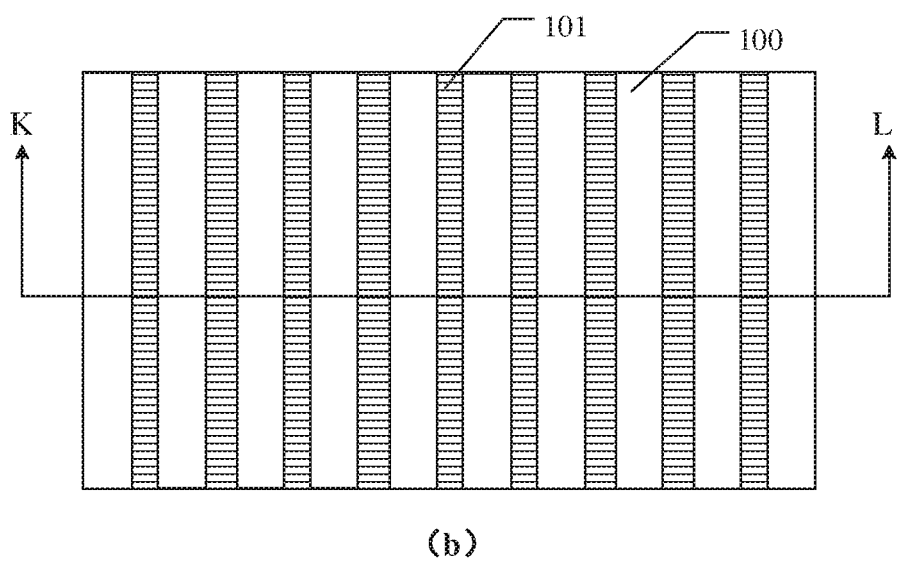

As shown in FIG. 2A and FIG. 2B, the first sub-pattern 211 is removed, and the base 100 having the plurality of grooves 101 may be served as an imprint template, for example, a nanoimprint template. In FIG. 2B, figure. b is a plan view, and figure. a is a cross-sectional view of the figure. b taken along K-L.

FIG. 1A to FIG. 1F, FIG. 3A and FIG. 3B are process diagrams of a method for manufacturing another template provided by an embodiment of the present disclosure, in which the template obtained by using the manufacturing method is a mask. The specific process for manufacturing the mask is as the following.

As shown in FIG. 1A to FIG. 1F, the photoresist pattern is formed on the base 100, and the photoresist pattern includes the plurality of first sub-patterns 211 spaced apart from each other. A process for producing the first sub-patterns may refer to the related explanation in the foregoing embodiments, and will be not repeated herein.

Figure 3A:
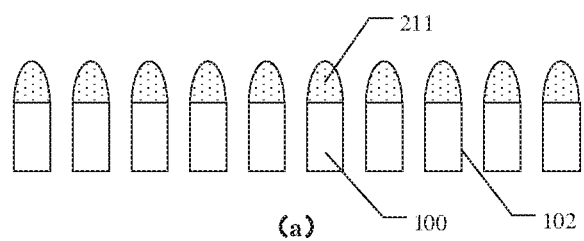
FIG. 3A and FIG. 3B are process diagrams of a method for manufacturing another template provided by some embodiments of the present disclosure.
Figure 3A:
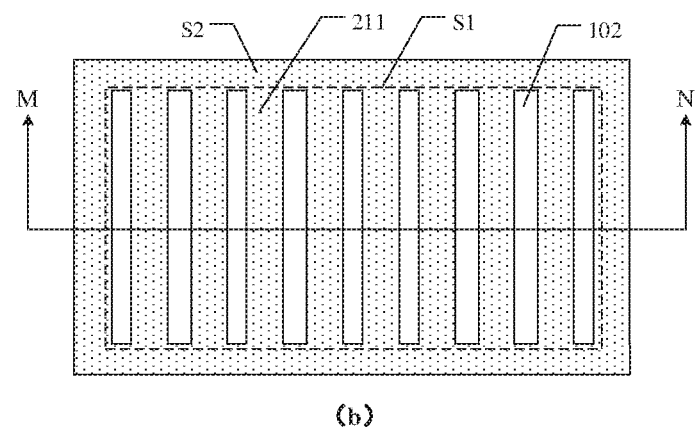

As shown in FIG. 1F and FIG. 3A, the base 100 is patterned by using the first sub-pattern 211 as a mask, a region of the base 100 not covered by the first sub-pattern 211 forms a plurality of openings 102, the opening 102 penetrates through the base 100. A process for patterning the base 100 may be a dry etching. A material used by the dry etching may be selected depending on the base material. In FIG. 3A, figure. b is a plan view, and figure. a is a cross-sectional view of the figure. b taken along M-N.

For example, in FIG. 3A, a process for producing the photoresist pattern in a region S1 (the first sub-patterns 211) may refer to the producing process as shown in FIG. 1A to FIG. 1F, and a region S2 surrounding the region S1 is covered by the photoresist. For example, initially when depositing the photoresist on the base, a thickness of the photoresist deposited in the region S2 is smaller than that of the photoresist deposited in the region S1, in this manner, during thinning by using the chemical mechanical grinding, while the photoresist in the region S1 is exposed by the first material layer, the photoresist in the region S2 is still covered by the first material layer. In this manner, during etching the photoresist (the first pattern) by using the first material layer as a mask, the photoresist in region S2 can be avoided to be etched.

Figure 3B:
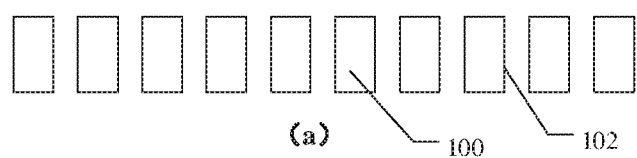
Figure 3B:
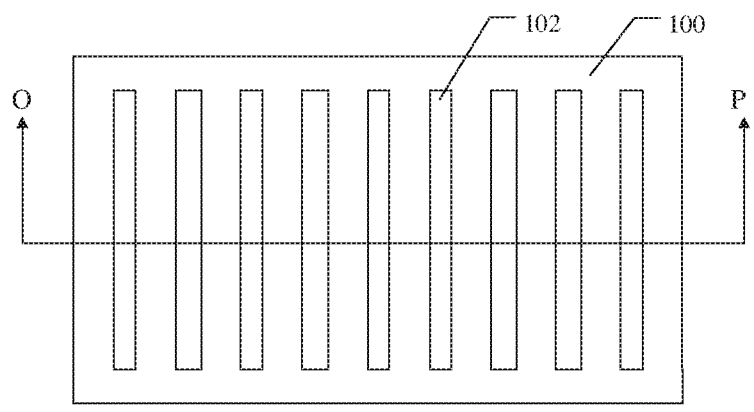

As shown in FIG. 3A and FIG. 3B, the first sub-pattern 211 is removed, and the base 100 having the plurality of openings 102 may be served as a mask. In FIG. 3B, figure. b is a plan view, and figure. a is a cross-sectional view of the figure. b taken along O-P.

FIG. 1A to FIG. 1F, FIG. 4A and FIG. 4B, FIG. 5A and FIG. 5B are process diagrams of a method for manufacturing another template provided by an embodiment of the present disclosure, in which the base includes a first base substrate and a first film layer laminated to each other, the first base substrate is used to form a template. The template obtained by using the manufacturing method is an imprint template. The specific process for manufacturing the imprint template is as the following.

As shown in FIG. 1A to FIG. 1F, the photoresist pattern is formed on the base 100, the photoresist pattern includes the plurality of first sub-patterns 211 spaced apart from each other. A process for producing the first sub-patterns may refer to the related explanation in the foregoing embodiments, and will be not repeated herein.

Figure 4A:
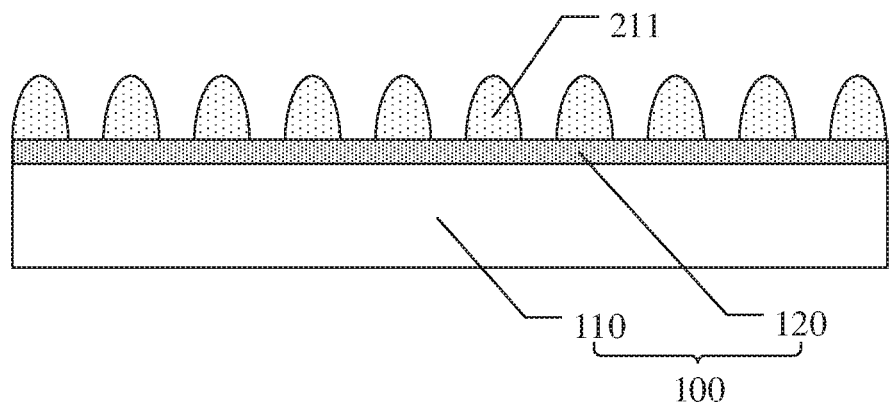
FIG. 4A and FIG. 4B, FIG. 5A and FIG. 5B are process diagrams of a method for manufacturing another template provided by some embodiments of the present disclosure.

As shown in FIG. 4A, a base 100 includes a first base substrate 100 and a first film layer 120 deposited on the first base substrate 110. For example, a material of the first film layer 120 may be an inorganic material, such as silicon nitride, silicon oxide, silicon oxynitride, and the like, and thereby the first film layer 120 may be used for forming a hard mask.

Figure 4B:
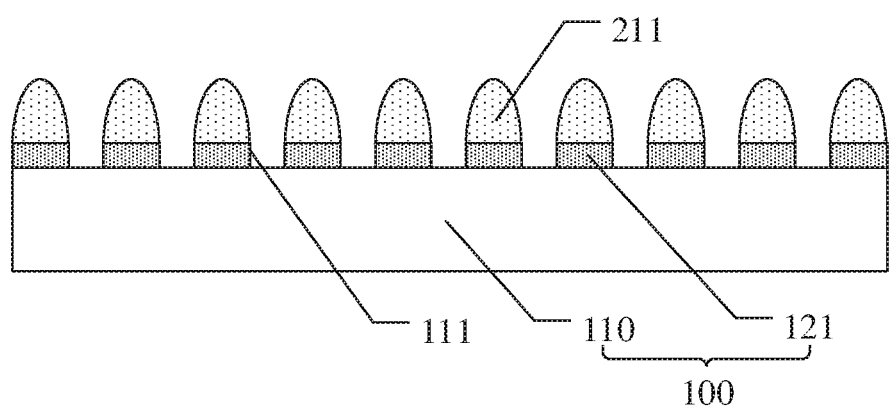

As shown in FIG. 4A and FIG. 4B, the first film layer 120 is patterned by using the first sub-pattern 211 as a mask, a region of the first film layer 120 not covered by the first sub-pattern 211 forms a plurality of first openings 111, and a remaining portion of the first film layer 120 forms a first mask 121. The first opening 111 penetrates through the first mask 121 to expose the first base substrate 110. A process for patterning the first film layer 120 may be a dry etching. A material used by the dry etching may be selected depending on a material of the first film layer 120. For example, an atmosphere of the dry etching may include $Cl_2$, $N_2$, $CH_4$, a power may be 100 w-1500 w, and a duration time may be 10 s-90 s. The process condition for the dry etching is not limited to the above scope, and may be adjusted depending on the actual process requirement.

Figure 5A:
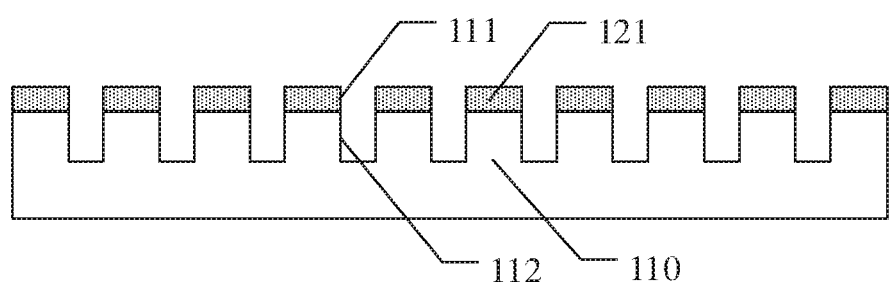

As shown in FIG. 4B and FIG. 5A, the first sub-pattern 211 is removed (by using the wet etching or the dry etching), the first base substrate 110 is patterned by using the first mask 121 as a mask, and the plurality of grooves 112 are formed in a region of the first base substrate 110 that is exposed by the first mask 121. A process for patterning the first base substrate 110 may be a dry etching. A material used by the dry etching may be selected depending on the material of the first base substrate 110. For example, a gas used by the dry etching may have better anisotropy. For example, an atmosphere of the dry etching may include $CHF_3$, $H_2$, Ar, a power may be 100 w-1000 w, and a duration time may be 10 s-90 s. The process condition for the dry etching is not limited to the above scope, and may be adjusted depending on the actual process requirement.

For example, in the template provided by at least one embodiment of the present disclosure, a region of the template that is formed by etching the photoresist pattern has a depth-to-width ratio of 1/10 to 1/100. For example, the first base substrate is patterned by using the first mask, the groove formed on the first base substrate may have a depth-to-width ratio which may at least be one to several tens, such as 1/30, 1/50, 1/70, and the like.

Figure 5B:
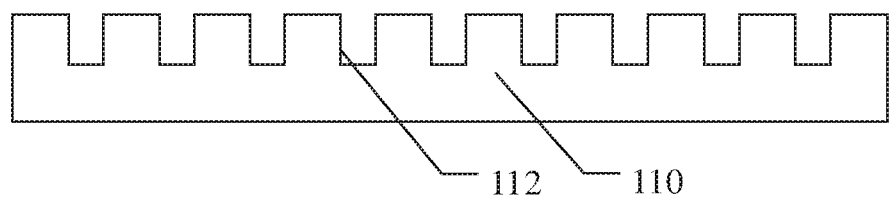

As shown in FIG. 5A and FIG. 5B, the first mask 121 is removed, and the first base substrate 110 having the plurality of grooves 112 may be served as an imprint template, for example, a nanoimprint template.

FIG. 1A to FIG. 1F, FIG. 4A and FIG. 4B, FIG. 6A and FIG. 6B are process diagrams of a method for manufacturing another template provided by an embodiment of the present disclosure, in which the base includes a first base substrate and a first film layer laminated to each other, and the first base substrate is used to form a template. The template obtained by using the manufacturing method is a mask. The specific process for manufacturing the mask plate are as the following.

As shown in FIG. 1A to FIG. 1F, FIG. 4A and FIG. 4B, the first mask 121 is formed on the first base substrate 110, and the first mask 121 includes the plurality of the first openings 111 spaced apart from each other. The process for producing the first mask 121 may refer to the related explanation in the foregoing embodiments, and will be not repeated herein.

Figure 6A:
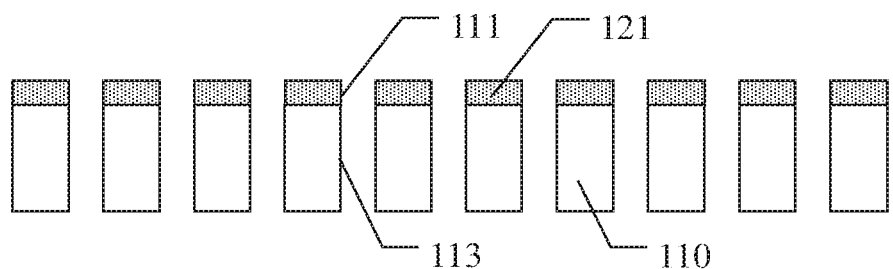

As shown in FIG. 4B and FIG. 6A, the first sub-pattern 211 is removed (by using the wet etching or the dry etching), the first base substrate 110 is patterned by using the first mask 121 as a mask, and the plurality of second openings 113 are formed in a region of the first base substrate 110 that is exposed by the first mask 121, and the second opening 113 penetrates through the first base substrate 110. A process for patterning the first base substrate 110 may be the dry etching. A material used by the dry etching may be selected depending on the material of the first base substrate 110. For example, a gas used by the dry etching may have better anisotropy.

Figure 6B:
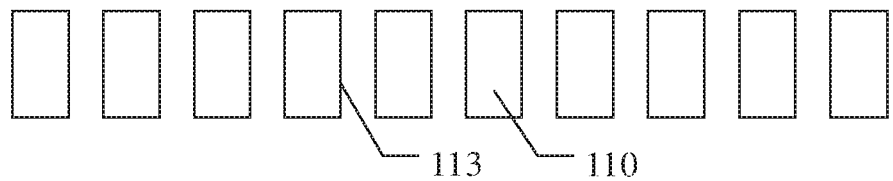

As shown in FIG. 6A and FIG. 6B, the first mask 121 is removed, and the substrate base plate 110 having the plurality of the second openings 113 may be served as a mask.

For example, in at least one embodiment of the present disclosure, the first base substrate may include a glass base substrate, a metal substrate or a substrate consisting of an organic material, and the like. The organic material may include polymethyl methacrylate (PMMA), polyoxymethylene (POM), polybutylene terephthalate (PBT), polyethylene terephthalate (PET), polycarbonate (PC), polyethylene (PE), polyetheretherketone (PEEK), polypropylene (PP), polystyrene (PS), polyvinylidene chloride (PVDC), etc. For example, under a condition that the base does not include the first film layer, the material of the base may refer to the material of the first base substrate.

In the embodiments of the present disclosure, as shown in FIG. 1A to FIG. 1F, the photoresist pattern serving as a mask for patterning the base includes the first sub-patterns, as compared with a case that the base is patterned by using the first pattern as a mask, the fineness of the pattern formed on the base (e.g., the number of patterns per unit area) are enhanced by twice. If the steps of FIG. 1C to FIG. 1F are repeated, one first pattern may be formed into four, eight, or more sub-patterns, so that the fineness of the patterns formed on the base by using the photoresist pattern can be enhanced by four times, eight times, or more. For example, the specific process of forming one first pattern into four sub-patterns is as the following.

FIG. 7A to FIG. 7D are partial process diagrams of a method for manufacturing another template provided by an embodiment of the present disclosure. FIG. 7A to FIG. 7D may be a repeating of the steps in FIG. 1C to FIG. 1F.

As shown in FIG. 1B and FIG. 1C, the first material is deposited on the first pattern 210 to form the first material film layer 301.

Figure 7A:
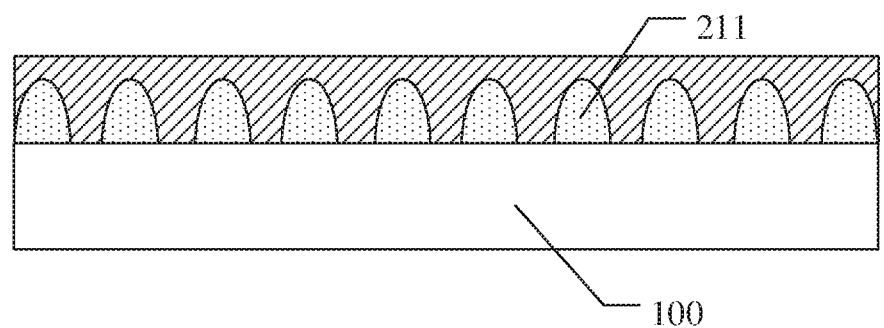
FIG. 7A to FIG. 7D are partial process diagrams of a method for manufacturing another template provided by some embodiments of the present disclosure.

As shown in FIG. 7A, in the steps according to FIG. 1A to FIG. 1F, after forming the first sub-pattern 211 on the base 100, the second material is deposited on the first sub-pattern 211 to form the second material film layer 301a. The second material may refer to the material of the first material layer, and will not be repeated herein.

Figure 7B:
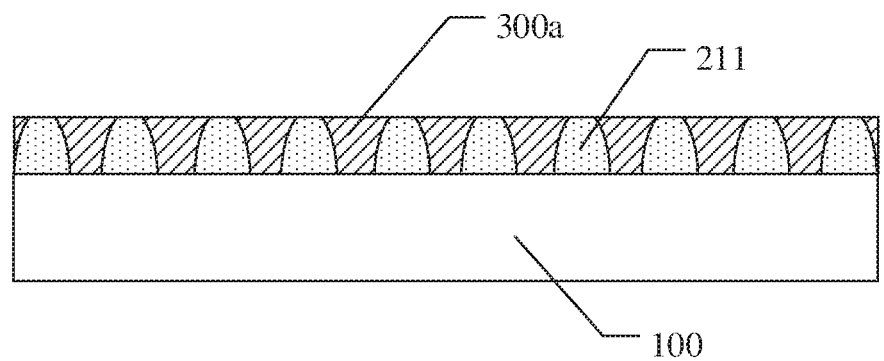

As shown in FIG. 7B, the second material film layer 301a is thinned to expose a middle portion of the first sub-pattern 211, the remaining portion of the second material film layer 301a is formed into a second material layer 300a after the thinning, and both sides of the first sub-pattern 211 are covered by the second material layer 300a. For example, the thinning method may include a chemical mechanical grinding.

Figure 7C:
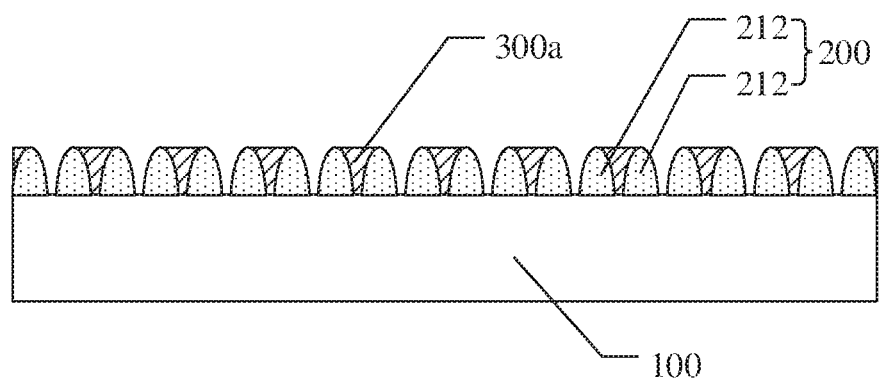

As shown in FIG. 7C, the first sub-pattern 211 is etched by using the second material layer 300a as a mask, one of the first sub-patterns 211 is formed into two second sub-patterns 212. The two sub-patterns 212 constitute a photoresist pattern 200. The process for etching the first sub-pattern 211 may include the dry etching, and a gas using in the dry etching has a small etching rate to the second material layer 300a and a large etching rate to the photoresist.

Figure 7D:
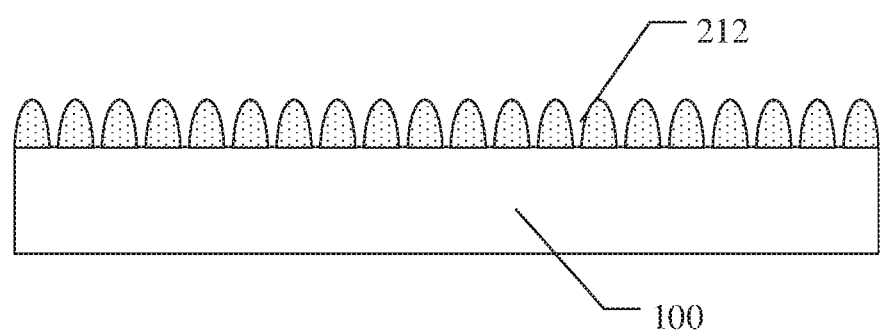

As shown in FIG. 7D, the second material layer 300a on the base 100 is removed. The base is patterned by using the photoresist pattern 200 comprising the second sub-pattern 212, the process may refer to the related explanation in the embodiments as shown in FIG. 2A and FIG. 2B; FIG. 3A and FIG. 3B; FIG. 4A and FIG. 4B, and FIG. 5A and FIG. 5B; FIG. 4A and FIG. 4B, and FIG. 6A and FIG. 6B; and will not be repeated herein.

For example, the steps shown in FIG. 7A to FIG. 7D are performed repeatedly once for the second sub-pattern 212, and one of the second sub-patterns 212 may be formed into two third sub-patterns spaced apart from each other, in this manner, as compared with a case that the base is patterned by using the first pattern as a mask, the fineness of the patterns formed on the base (e.g., the number of patterns) is enhanced by eight times. For example, the steps shown in FIG. 7A to FIG. 7D are performed repeatedly multiple times for the remaining photoresist pattern on the base, the fineness of the template pattern (e.g., the number of patterns per unit area) obtained by patterning using the photoresist pattern may be further enhanced.

At least one embodiment of the present disclosure provides a template, the template is obtained by the manufacturing method of any one of the above embodiments. For example, the template may be an imprint template and also be a mask. A structure of the template may refer to the related explanation in the foregoing embodiments, and will be not repeated herein.

For example, in the template provided by at least one embodiment of the present disclosure, the template at least includes a pattern which is formed by using the photoresist pattern, and the pattern has a line width less than or equal to 100 nm. The line width of the pattern of the template is related to the line width of the photoresist pattern for producing the template, and the process for manufacturing the photoresist pattern may refer to the related explanation in the foregoing embodiments, and will be not repeated herein.

At least one embodiment of the present disclosure provides a device, and at least a portion of elements of the device is produced by the template manufactured by using any one of the above embodiments.

For example, the device may be a display device. For example, the display device may be a television, a digital camera, a cell phone, a watch, a tablet, a laptop, a navigator or other products and components.

For example, the mask provided by the embodiments of the present disclosure may be used for producing a grating structure, such as a metal grating. For example, the metal grating may be an electrode structure. For example, the metal grating may have a function of light polarization.

For the present disclosure, the following statements should be noted:

(1) The accompanying drawings of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a region may be enlarged, that is, the accompanying drawings are not drawn according to the actual scale.

(4) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

What is claimed is:

1. A manufacturing method of a template, comprising:
   providing a base;
   forming a photoresist pattern on the base, comprising:
      forming a plurality of first photoresist patterns spaced apart from each other by using a photoresist on the base;
      forming a first material layer on the plurality of first photoresist patterns, the first material layer at least covering one side of at least one of the plurality of first photoresist patterns in a direction perpendicular to a surface on which the base is located;
      etching the at least one first photoresist pattern by using the first material layer as an etch mask so that only a portion of the at least one first photoresist pattern not covered by the first material is etched out and the first photoresist pattern is formed into a plurality of first photoresist sub-patterns; and
      removing the first material layer; and
   patterning the base by using the photoresist pattern as an etch mask,
   wherein the forming the first material layer on the plurality of first photoresist patterns comprises:
      depositing a first material film layer on the plurality of first photoresist patterns, to cover the plurality of first photoresist patterns; and
      thinning the first material film layer, to expose a middle portion of at least one of the plurality of first photoresist patterns;
   wherein a remaining portion of the first material film layer is the first material layer,
   wherein a method for thinning includes a chemical mechanical grinding, in the chemical mechanical grinding, a grinding solution is acidic and contains nano-sized grinding particles, the nano-sized grinding particles are aluminum oxide nano-sized grinding particles,
   wherein a material of the first material layer is molybdenum.

2. The manufacturing method of claim 1, wherein the at least one first photoresist pattern is patterned by using the first material layer as the etch mask, so that one of the first photoresist patterns is formed into two of the first photoresist sub-patterns.

3. The manufacturing method of claim 2, wherein in the direction perpendicular to the surface on which the base is located, the first material layer covers both sides of the at least one first photoresist pattern and exposes a middle portion of the at least one first photoresist pattern.

4. The manufacturing method of claim 3, wherein in a direction parallel to the surface on which the base is located and perpendicular to an extending direction of the plurality of first photoresist patterns, a size of a portion of the first photoresist pattern which is exposed by the first material layer is 2% to 20% of a size of the first photoresist pattern.

5. The manufacturing method of claim 2, wherein in a direction parallel to the surface on which the base is located and perpendicular to an extending direction of the plurality of first photoresist patterns, a size of a portion of the first photoresist pattern which is exposed by the first material layer is 2% to 20% of a size of the first photoresist pattern.

6. The manufacturing method of claim 1, wherein the forming a plurality of first photoresist patterns spaced apart from each other on the base comprises:
   forming a photoresist layer on the base;
   patterning the photoresist layer; and
   post-baking and processing the photoresist layer to form the plurality of first photoresist patterns.

7. The manufacturing method of claim 6, wherein a vertical cross-section shape of the first photoresist pattern comprises a semicircle-like shape.

8. The manufacturing method of claim 7, wherein the photoresist layer comprises a plurality of photoresist strips having a vertical cross-section with a rectangle-like shape, and the post-baking the photoresist layer comprises:
   heating the photoresist strip, so that the photoresist strip is melted; and
   cooling and curing the photoresist strip, to form the plurality of first photoresist patterns;
   wherein after the photoresist strip is melted, the vertical cross-section shape of the photoresist strip changes from a rectangle-like shape to a semicircle-like shape.

9. The manufacturing method of claim 6, wherein the photoresist layer is patterned by using a laser beam.

10. The manufacturing method of claim 1, wherein the photoresist pattern has a line width less than or equal to 100 nm.

11. The manufacturing method of claim 1, wherein the forming the photoresist pattern on the base further comprises:
   after removing the first material layer, depositing a second material film layer on the first photoresist sub-pattern, to cover the first photoresist sub-pattern;
   thinning the second material film layer, to expose a portion of at least one of the first photoresist sub-pattern, and a remaining portion of the second material film layer is a second material layer;
   patterning the at least one first photoresist sub-pattern by using the second material layer as an etch mask, so that the first photoresist sub-pattern is formed into at least one second sub-pattern; and
   removing the second material layer.

12. The manufacturing method of claim 1, wherein the forming the photoresist pattern on the base further comprises:
   after removing the remaining portion of the first material film layer, depositing a second material film layer on a remaining portion of the photoresist on the base, to cover the remaining portion of the photoresist;
   thinning the second material film layer, to expose a portion of the remaining portion of the photoresist;
   patterning the remaining portion of the photoresist by using a remaining portion of the second material film layer as an etch mask; and
   removing the remaining portion of the second material film layer;
   wherein the above steps are repeatedly performed at least once, so that the first sub-pattern is formed into at least one third sub-pattern.

13. The manufacturing method of claim 1, wherein the patterning the base by using the photoresist pattern as the etch mask comprises:
   patterning the base by using the photoresist pattern, to form a groove or an opening penetrating through the base in a region of the base not covered by the photoresist pattern.

14. The manufacturing method of claim 1, wherein the base comprises a first base substrate and a first film layer covering the first base substrate, and the patterning the base by using the photoresist pattern as the etch mask comprises:
   patterning the first film layer by using the photoresist pattern, to form a first opening penetrating through the first film layer in a region of the first film layer not covered with the photoresist pattern, so as to form a first mask by using the first film layer;
   patterning the first base substrate by using the first mask, forming a groove or a second opening penetrating through the first base substrate in a region of the first base substrate not covered by the first mask; and
   removing the first mask.

15. The manufacturing method of claim 14, wherein the first film layer comprises an inorganic film.

16. The manufacturing method of claim 1, wherein the first material layer comprises a metal layer.

17. The manufacturing method of claim 1, wherein in a direction parallel to the surface on which the base is located and perpendicular to an extending direction of the plurality of first photoresist patterns, a size of a portion of the first pattern which is exposed by the first material layer is 2% to 20% of a size of the first photoresist pattern.

* * * * *